(12) United States Patent
Jung et al.

(10) Patent No.: US 7,382,631 B2
(45) Date of Patent: Jun. 3, 2008

(54) CIRCUIT BOARD MOUNTING PANEL FOR ELECTRICAL APPLIANCE

(75) Inventors: Hyun-Jun Jung, Suwon-si (KR); Kyung-kyun Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/345,408

(22) Filed: Feb. 2, 2006

(65) Prior Publication Data
US 2006/0203461 A1    Sep. 14, 2006

(30) Foreign Application Priority Data
Mar. 8, 2005    (KR)    ............... 10-2005-0019339

(51) Int. Cl.
*H05K 9/00*    (2006.01)
(52) U.S. Cl. ............... 361/816; 361/800; 361/818; 361/753; 361/799; 174/350; 174/365; 174/387
(58) Field of Classification Search ........... 174/50, 174/350, 365, 387; 455/347, 66.1; 439/607; 361/752, 753, 799, 800, 816, 818, 730
See application file for complete search history.

(56) References Cited

U.S. PATENT DOCUMENTS

| | | | | |
|---|---|---|---|---|
| 4,084,214 A | * | 4/1978 | Eppich | 361/680 |
| 4,166,665 A | * | 9/1979 | Cutchaw | 439/196 |
| 4,560,079 A | * | 12/1985 | Eddleston et al. | 220/4.02 |
| 4,593,813 A | * | 6/1986 | Powel | 206/708 |
| 4,620,265 A | * | 10/1986 | Lerude et al. | 361/816 |
| 4,630,175 A | * | 12/1986 | Lerude et al. | 361/816 |
| 5,633,786 A | * | 5/1997 | Matuszewski et al. | 361/818 |
| 5,796,594 A | * | 8/1998 | Kabat et al. | 361/818 |
| 6,003,052 A | * | 12/1999 | Yamagata | 708/100 |
| 6,195,269 B1 | * | 2/2001 | Hino | 361/816 |
| 6,224,420 B1 | * | 5/2001 | Nishio et al. | 439/566 |

(Continued)

FOREIGN PATENT DOCUMENTS

JP    2002-324989    11/2002

(Continued)

OTHER PUBLICATIONS

Korean Office Action dated Aug. 30, 2006 issued in KR 2005-19339.

*Primary Examiner*—Tuan T. Dinh
*Assistant Examiner*—Dameon E Levi
(74) *Attorney, Agent, or Firm*—Stanzione & Kim, LLP

(57) ABSTRACT

The present invention relates to a circuit board mounting panel for electrical appliance, comprising: a base panel disposing a first printed circuit board and a second printed circuit board thereon; a first shield cover disposed on the base panel and mounting the first printed circuit board therein and formed with an opening part in a vertical direction to a surface of the first printed circuit board; and a second shield cover mounting the second printed circuit board therein and inserted into the first shield cover through the opening part and coupled to the base panel. Thus, the present invention provides an improved structure of a shield cover for a circuit board mounting panel for an electrical appliance, thereby minimizing a idle mold that may be produced while developing a circuitry or a PCB.

17 Claims, 4 Drawing Sheets

U.S. PATENT DOCUMENTS

| | | | |
|---|---|---|---|
| 6,225,554 B1 * | 5/2001 | Trehan et al. | 174/371 |
| 6,324,075 B1 * | 11/2001 | Unrein et al. | 361/816 |
| 6,344,609 B1 * | 2/2002 | Nakano | 174/351 |
| 6,544,061 B1 * | 4/2003 | Yasufuku et al. | 439/310 |
| 7,072,699 B2 * | 7/2006 | Eiden | 455/575.8 |
| 7,180,754 B2 * | 2/2007 | Qin et al. | 361/797 |
| 7,313,002 B2 * | 12/2007 | Yuan et al. | 361/818 |
| 2002/0149922 A1 * | 10/2002 | Takeda | 361/816 |

FOREIGN PATENT DOCUMENTS

| KR | 121386 | 4/1998 |
|---|---|---|
| KR | 151875 | 6/1998 |
| KR | 20-178229 | 4/2000 |

* cited by examiner

CIRCUIT BOARD MOUNTING PANEL FOR ELECTRICAL APPLIANCE

CROSS-REFERENCE TO RELATED APPLICATIONS

This application claims the benefit of Korean Patent Application No. 2005-0019339, filed on Mar. 8, 2005, in the Korean Intellectual Property Office, which is hereby incorporated by reference in its entirety.

BACKGROUND OF THE INVENTION

1. Field of the Invention

The present invention relates to a circuit board mounting panel for an electrical appliance, and more particularly, to a circuit board mounting panel for an electrical appliance comprising a shield cover mounting a printed circuit board.

2. Description of the Related Art

Conventionally, printed circuit boards (PCB) have been used for driving a variety of electrical appliances. FIG. 1 is a perspective view illustrating a circuit board mounting panel 20 installed on a conventional display device 10. Referring to FIG. 1, on the circuit board mounting panel 20 are disposed a plurality of printed circuit boards (not shown) generating an image driving signal and an image driving power etc. Further, on the circuit board mounting panel 20 are disposed a plurality of shield covers 11, 12, 13, 14 for protecting the PCBs from outside environment. The shield covers 11, 12, 13, 14 not only protect the PCBs, but also can cut off effluence of an electric-magnetic interference (EMI) generated from the PCBs. Therefore, a mold for the shield covers 11, 12, 13, 14 should be appropriately designed to accommodate the PCBs mounted in the shield covers.

However, the sizes of the PCBs often change as the circuit develops. Consequently, the mold used to manufacture the shield covers 11, 12, 13, 14 housing the PCBs should be re-designed and re-made, thereby rendering the original mold idle and/or useless. Further, use of the shield covers 11, 12, 13, 14 during early development of the circuit is often necessary because EMI shielding is needed to properly design the circuit.

SUMMARY OF THE INVENTION

The present invention provides an improved shield cover for a circuit board mounting panel that minimizes and/or prevents creation of idle molds during a PCB and/or circuit development process.

One embodiment of the invention provides a circuit board mounting panel. The circuit board mounting panel may include a base panel on which a first printed circuit board and a second printed circuit board are disposed. A first shield cover may be disposed on the base panel to enclose the first printed circuit board therein. The first shield cover may be formed to include an opening therein. The opening may be formed in a side surface of the first shield cover. A second shield cover may also be formed on the circuit board mounting panel and may include a portion that is insertable into the first shield cover through the opening. One or both of the first shield cover or the second shield cover may be coupled to the base panel.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF EXEMPLARY EMBODIMENTS

Figure 1:
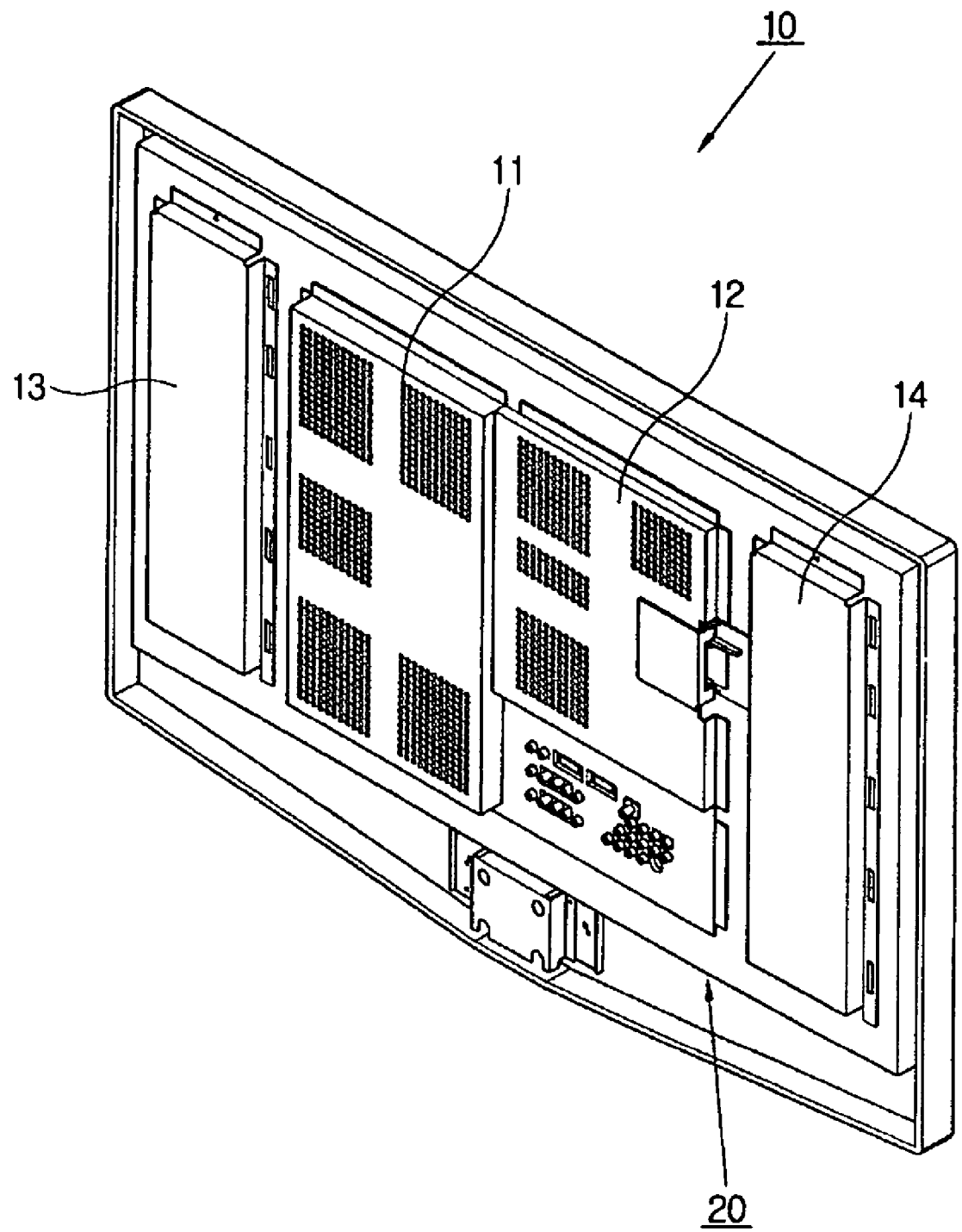
FIG. 1 is a perspective view illustrating a display device which is mounted with a circuit board mounting panel of a conventional electrical appliance.

Reference will now be made in detail to the embodiments of the present invention, examples of which are illustrated in the accompanying drawings, wherein like reference numerals refer to like elements throughout. The embodiments are described below so as to explain the present invention by referring to the figures.

Figure 2:
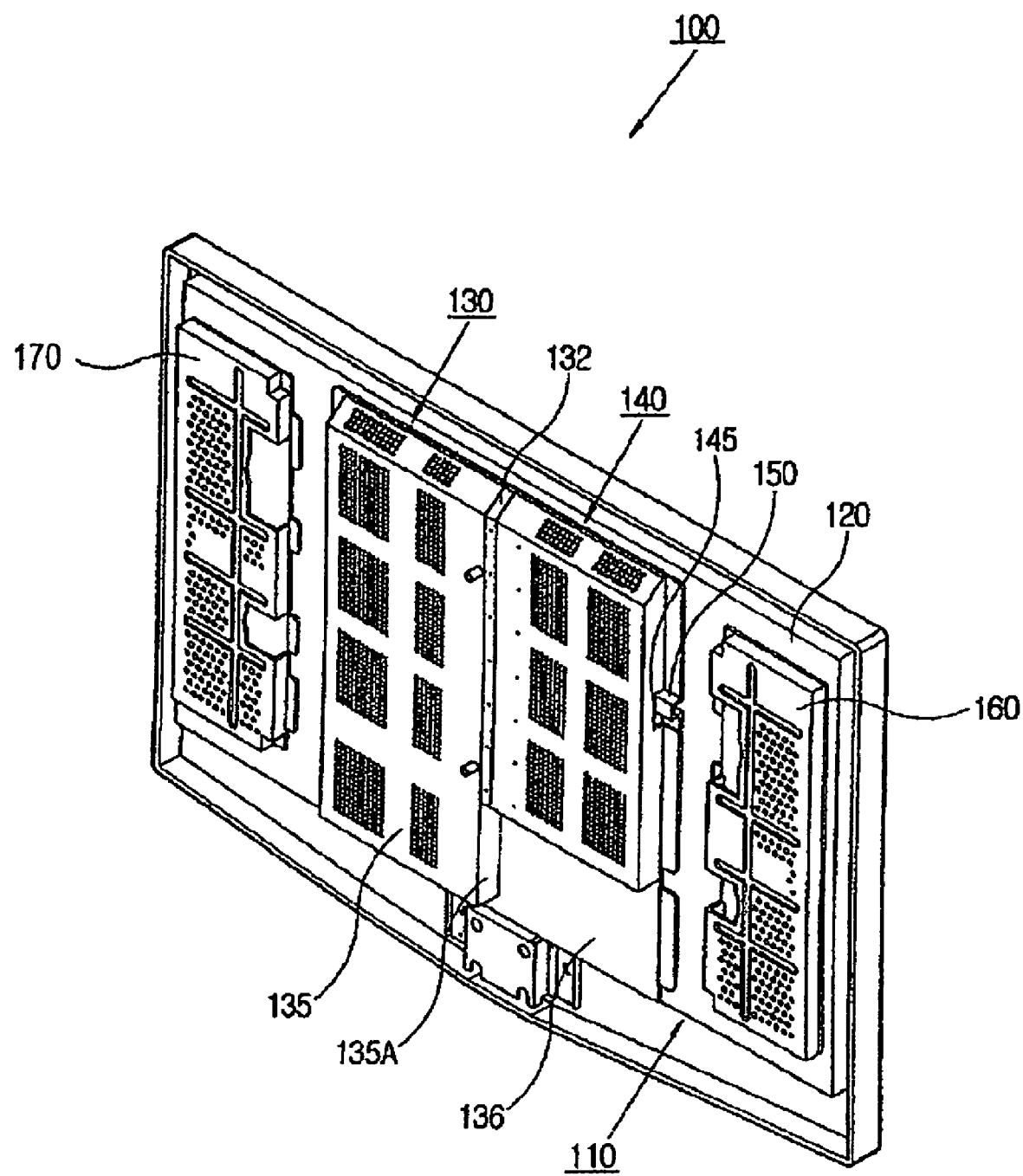
FIG. 2 is a perspective view illustrating a display device which is mounted with a circuit board mounting panel of an electrical appliance according to an embodiment of the present invention.

Referring to FIG. 2, a flat panel display 100 manufactured according to an embodiment of the invention may include a circuit board mounting panel 110 coupled to the display's rear surface. The circuit board mounting panel 110 may include a plurality of printed circuit board (PCB) shield covers 130, 140, 150, and 160. Shield cover 130 may enclose a PCB in which an image driving circuit is formed. Shield cover 140 may enclose a PCB in which an image driving signal circuit is formed. The image driving circuit may operate to transfer a signal to the image driving power circuit.

Referring to FIG. 2, a flat panel display 100 manufactured according to an embodiment of the invention may include a circuit board mounting panel 110 coupled to the display's rear surface. The circuit board mounting panel 110 may include a plurality of printed circuit board (PCB) shield covers 130, 140, 160, and 170. Shield cover 130 may enclose a PCB in which an image driving circuit is formed. Shield cover 140 may enclose a PCB in which an image driving signal circuit is formed. The image driving circuit may operate to transfer a signal to the image driving power circuit.

Each shield cover may include a substantially planar top surface that is substantially orthogonally connected to one or more side surfaces. One or more side surfaces of each shield cover may include tabs that substantially orthogonally extend therefrom. Each tab may include one or more openings through which fasteners may be inserted to secure the shield cover(s) to the circuit board mounting panel 110. Thus, when coupled with the circuit board mounting panel 110, each shield cover 130, 140, 160, and 170 may project outwards from a surface of the circuit board mounting panel 110 to encapsulate a corresponding PCB in a space provided between an inner upper surface of each shield cover and the surface of the circuit board mounting panel 110.

In the embodiment depicted in FIG. 2, the shield cover 170 may be positioned proximate a left side of the circuit board mounting panel 110. The right side of the shield cover 170 may be separated from the next shield cover 130 by a space. The shield cover 130 may adjoin movable shield cover 140, which may be configured to slidably engage a slot formed in a side surface of the shield cover 130. The right side of the shield cover 140 may be separated from another shield cover 160 by a space. In turn, the shield cover 160 may be positioned on a right side of the circuit board mounting panel 110. Alternatively, the base 136 may be positioned at other areas about the raised portion 135.

The raised portion 135 of the shield cover 130 may further include a side surface 135a formed along the right edge of the shield cover 130. The side surface 135a may couple the top surface of the shield cover's raised portion 135 with the base 136. An opening 131 may be formed in the side surface 135a, and an affixing member 132 may project substantially horizontally from the top edge of the opening 131. The opening 131 and/or the affixing member 132 may extend along all or part of the length of the side surface 135a. For example, in the embodiment depicted in FIG. 2, both the opening 131 and the affixing member 132 begin at a top edge of the raised portion 135 and extend downward about two thirds of the length of the side surface 135a.

Figure 3:
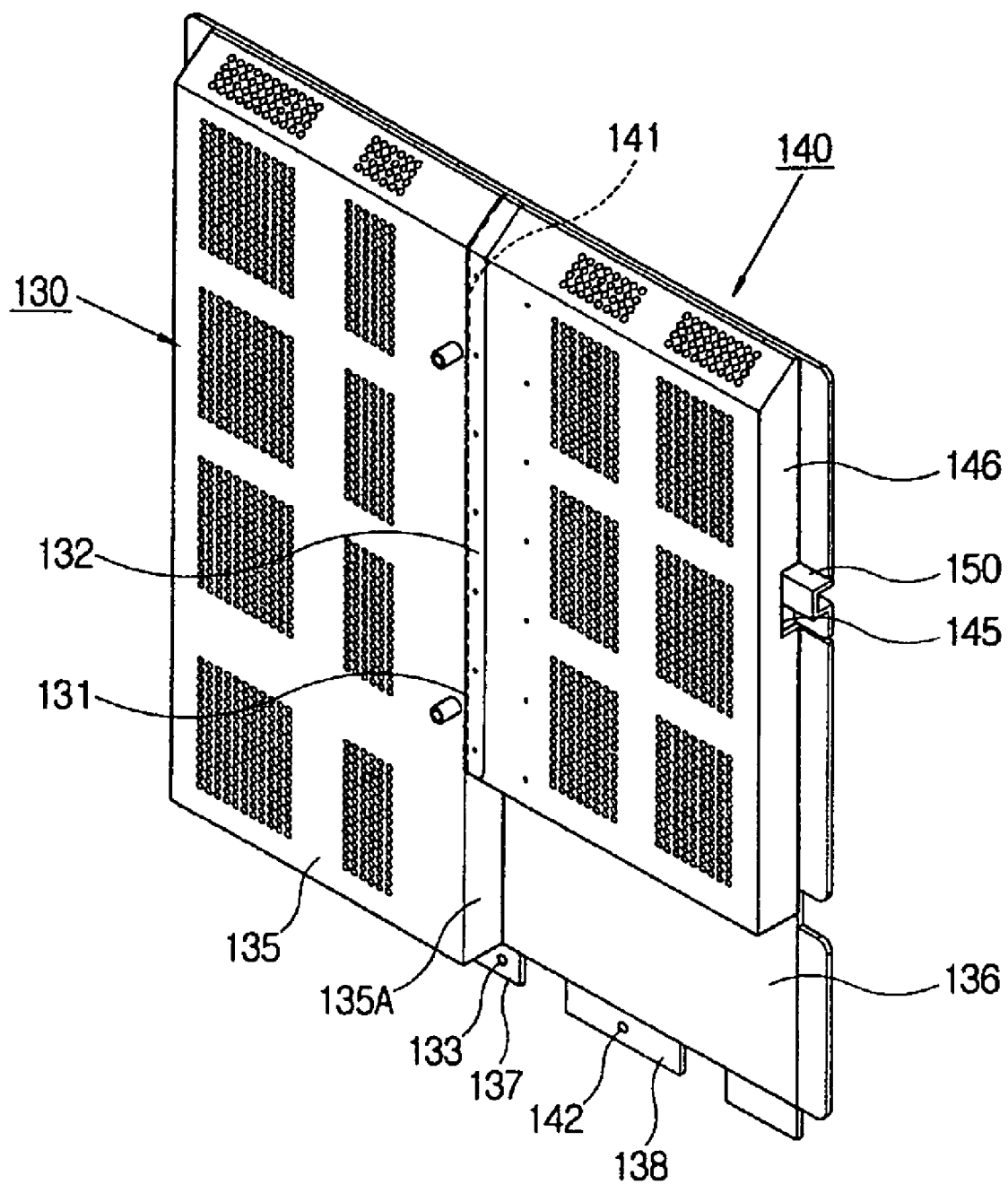
FIG. 3 is a perspective view illustrating a first coupling state of a first and a second shield covers according to the embodiment of the present invention.

Additionally, one or both of the raised portion 135 and the base 136 may include a tab 137 or 138 that laterally extends therefrom. Each tab 137 or 138 may include an opening therein through which a fastener may be inserted to secure the shield cover 130 (and/or shield cover 140) to the circuit board mounting panel 110. For example, as shown in FIG. 3, the raised portion 135a includes a tab 137 extending substantially horizontally downward from its bottom edge. Additionally, the base 136 includes a tab 138 extending downward from its bottom edge. A fastener opening 133 is formed in tab 137, and a fastener opening 142 is formed in tab 138.

The base 136 may also include a raised member 150. The raised member 150 may include a length greater than its width, and may be positioned in an upper right portion of the base 136. Additionally, the raised member 150 may be oriented so that its longitudinal axis is substantially orthogonal to the side surface 135a of the shield cover 130. Moreover, the raised member 150 may project upwards from the top surface of the base 136, and an end of the raised member 150 may be flush with a right edge of the base member 136. As further described below, the raised member 150 may slidably (and/or adjustably) couple with the shield cover 140.

In the embodiment depicted in FIGS. 2 and 3, the shield cover 140 may adjustably couple with both the shield cover 130 and/or with the raised member 150. More particularly, a left-side portion (141 in FIG. 3) of the shield cover 140 may be configured to slidably engage the opening 131 formed in the right-hand side surface 135a of the shield cover 130. When part of the left-hand portion 141 is inserted into the opening 131, the affixing member 132 may overlap another part of the left-side portion 141, as shown in FIGS. 2 and 3. Additionally, a right-side surface 146 of the shield cover 140 may include a notch 145 therein that surrounds and/or adjustably engages the raised member 150.

Figure 4:
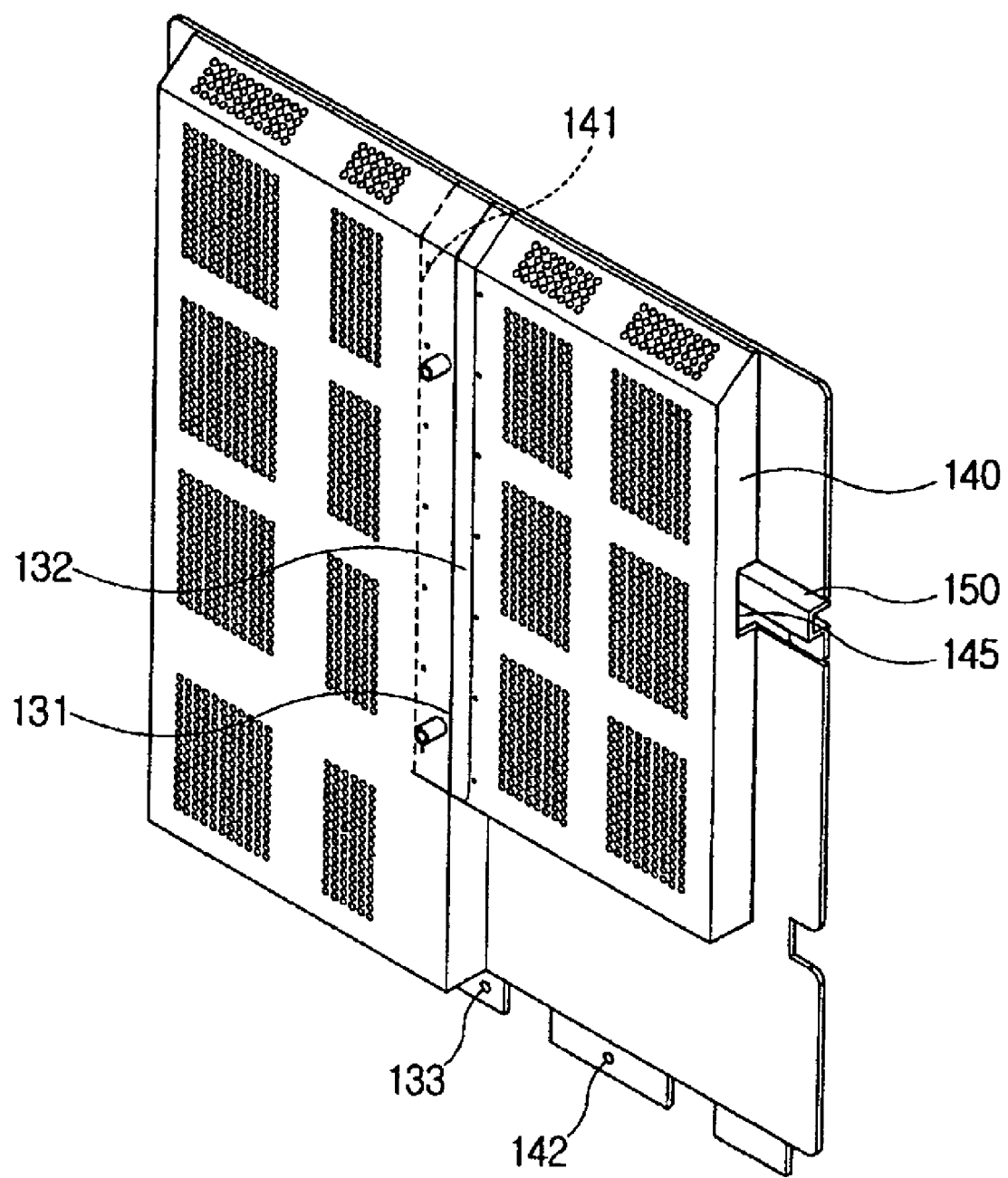
FIG. 4 is a perspective view illustrating a second coupling state of a first and a second shield covers according to another embodiment of the present invention.

Although not shown in FIG. 2, 3, or 4, the shield cover 140 may be formed without a side surface on its left-hand side. Thus, when the left-hand portion 141 engages the opening 131, the enclosed area of the shield cover 130 may combine with the enclosed area of the shield cover 140. In this manner, the amount of space needed to enclose PCBs of differing sizes may be varied as needed.

Referring to FIGS. 3 and 4, the shield cover 140 may be adjustable between a first position shown in FIG. 3 and a second position shown in FIG. 4. In the first position, the shield cover 140 may be fully extended from the shield cover 130, and only a small portion of the left-hand portion 141 of the shield cover 140 may engage the opening 131. In the second position, shown in FIG. 4, the shield cover 140 may be moved toward the shield cover 130. Consequently, more of the left-hand portion 141 protrudes past the side wall 135 of the shield cover 130. During insertion (or withdrawal), the shield cover 140 may be guided by the raised member 150, which may adjustably engage a notch 145 formed in the right-hand side surface 146 of the shield cover 140. Once the shield cover 140 is suitably positioned to accommodate a particular size of PCB (or PCBs) that is/are to be enclosed by the shield cover 130 and/or the shield cover 140, a part of the left-hand portion 141 may be coupled with the affixing member 131 by spot welding or other suitable fastening means.

Although only one opening 131 was described above, the invention may include an additional opening (or openings) formed in other portions of the raised portion 135 of the shield cover 130. In such embodiments, additional shield covers 140 may be configured to insert and detach with each of the additional openings.

Thus, embodiments of the invention may be used to adjust an area enclosed by a shield cover to adapt to changes in size made to a PCB during a development process. The ability of the shield cover to change size without having to re-manufacture the shield cover (or shield cover mold) is especially advantageous.

Although illustratively shown enclosing an area proximate a center region of the circuit board mounting panel 110 that is coupled to the back of a flat panel display, the adjustable shield covers 130 and 140 may find use in virtually any appliance that uses a printed circuit board. Thus, the invention is not limited merely to the flat panel display environment described herein, but may include other technological environments such as computers, radios, televisions, home appliances, etc.

It will be apparent to those skilled in the art that various modifications and variation can be made in the present invention without departing from the spirit or scope of the invention. Thus it is intended that the present invention cover the modifications and variations of this invention provided they come within the scope of the appended claims and their equivalents.

What is claimed is:

1. A circuit board mounting panel, comprising:
   a base panel;
   a first shield cover disposed on the base panel to enclose at least one printed circuit board therein; and
   a second shield cover disposed on the base panel adjacent the first shield cover to enclose the at least one printed circuit board therein, wherein a portion of the second shield cover is slidably displaceable relative to the first shield cover and received therein, to enclose an area of variable dimensions.

2. The circuit board mounting panel of claim 1, wherein the first shield cover further comprises:
   a side surface in which an opening configured to slidably couple with the portion of the second shield cover is formed; and
   an affixing member that overlaps a top surface of the second shield cover when the portion of the second shield cover slidably couples with the opening.

3. The circuit board mounting panel of claim 2, wherein the second shield cover comprises a second side surface in which a second opening is formed, and the second opening engages the opening formed in the side surface of the first shield cover.

4. The circuit board mounting panel of claim 2, wherein the affixing member is spot welded to a portion of the top surface of the second shield cover.

5. The circuit board mounting panel of claim 1, further comprising:
   a third shield cover to enclose the at least one printed circuit board therein,
   wherein a portion of the third shield cover is slidably displaceable with respect to the first shield cover to provide another enclosed area of variable dimensions.

6. A device that comprises the circuit board mounting panel of claim 1.

7. The device of claim 6, wherein the device is a flat panel display.

8. A circuit board mounting apparatus to mount at least one circuit board thereon, the circuit board mounting apparatus comprising:
   a mounting panel to mount the at least one circuit board thereon;
   a first shield cover to attach to the mounting panel, the first shield cover having a raised portion projecting from the mounting panel, the first shield cover including a planar base portion adjacent the raised portion thereof; and
   a second shield cover to slidably engage with the first shield cover, the second shield cover having a raised portion projecting from the mounting panel, the second shield cover enclosing a portion of the base portion of the first shield cover.

9. The apparatus of claim 8, wherein the base portion includes an elongated raised member projecting therefrom.

10. The apparatus of claim 9, wherein the second shield cover includes a side surface on a side thereof perpendicular to the raised member, the side surface having a notch formed therein to slidably receive the raised member.

11. The apparatus of claim 8, wherein the base portion includes at least one tab extending laterally therefrom, the at least one tab having an opening formed therein through which a fastener extends to fasten the first shield cover to the mounting panel.

12. The apparatus of claim 8, wherein the first shield cover and the second shield cover respectively include side surfaces on sides of the respective raised portion and respectively perpendicular therewith.

13. The apparatus of claim 12, wherein the first shield cover includes at least one tab extending perpendicularly from the side surfaces thereof, the at least one tab having an opening formed therein through which a fastener extends to fasten the first shield cover to the mounting panel.

14. The apparatus of claim 8, wherein the first shield cover includes an affixing member extending from the edge of the raised portion of the first shield cover to couple the raised portion of the second shield cover thereto.

15. The apparatus of claim 8, wherein a side of the first shield cover includes an opening formed therein to slidably receive a portion of the second shield cover.

16. The apparatus of claim 15, wherein a side of the second shield cover adjacent the opening in the side of the first shield cover includes an opening formed therein.

17. The circuit board mounting panel of claim 1, wherein the first shield cover and the second shield cover are respectively constructed to inhibit electromagnetic interference.

* * * * *